United States Patent [19]
Goldberg et al.

[11] 4,099,075
[45] Jul. 4, 1978

[54] SIGNAL DETECTION APPARATUS USING AN ADAPTIVE THRESHOLD

[75] Inventors: Howard S. Goldberg, Schenectady; William E. Engeler; Richard D. Baertsch, both of Scotia, all of N.Y.

[73] Assignee: General Electric Company, Schenectady, N.Y.

[21] Appl. No.: 780,294

[22] Filed: Mar. 23, 1977

[51] Int. Cl.² .............................................. H03K 5/20
[52] U.S. Cl. .................................... 307/352; 328/117; 328/151; 307/221 D
[58] Field of Search ................... 307/221 D, 350, 352, 307/353; 328/37, 151, 115, 116, 117

[56] References Cited
U.S. PATENT DOCUMENTS

| | | |
|---|---|---|
| Re. 26,104 | 11/1966 | Glauberman et al. ........... 307/252 X |
| 3,602,826 | 8/1971 | List et al. ............................ 328/117 |
| 3,819,953 | 6/1974 | Puckette et al. ................ 307/221 D |
| 3,900,744 | 8/1975 | Lammers ............................ 307/350 |

Primary Examiner—John S. Heyman
Attorney, Agent, or Firm—J. J. Zaskalicky; J. T. Cohen; M. Snyder

[57] ABSTRACT

In signal detection apparatus for sensing large excursion of a time varying signal from its average value, charge transfer circuits are utilized to provide a threshold level for detection which adapts to the changing average value of the background component of the time varying signal.

8 Claims, 6 Drawing Figures

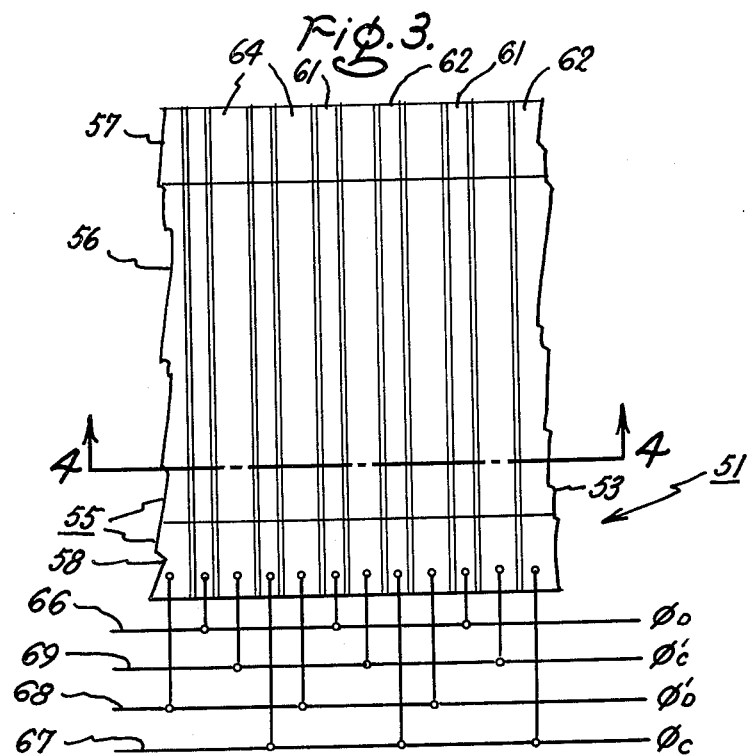
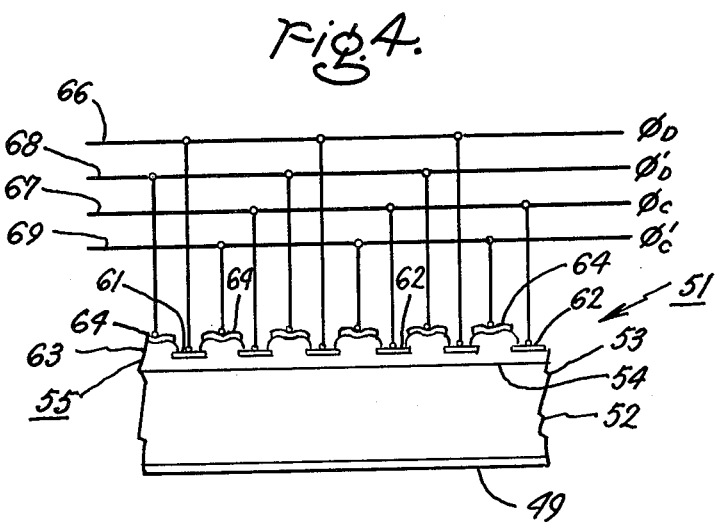

SIGNAL DETECTION APPARATUS USING AN ADAPTIVE THRESHOLD

The present invention relates in general to signal detection apparatus utilizing an adaptive threshold and in particular to such apparatus implemented by charge transfer devices.

A problem common to many signal detection apparatus is that of identifying a large excursion in a signal corresponding to a target in the presence of smaller excursions corresponding to background which may include signal-like clutter as well as noise in general. Typically a threshold level is chosen and excursions of signal exceeding this threshold level trigger an alarm. Difficulties arise in the selection of a threshold level which is both sufficiently high to avoid excess false alarms due to the aforementioned background noise and clutter and at the same time low enough to allow an acceptable probability of detection of the large excursions which represent targets.

An example of detection apparatus which requires that the target component be distinguished from the noise component of a signal is infrared search apparatus. As the infrared search apparatus scans the sky a signal is generated the amplitude of which varies as a function of time according to the spatial variation of the infrared radiation in the field of view. A target will appear as a point source of radiation. If the character of the noise due to background radiation is known, for example, blue sky noise, then a threshold level can be fixed at some multiple $k$ of a suitable measure of the noise $\sigma_o$. The probability of false alarm determined by the frequence of encounter of noise spikes higher or greater in amplitude than $\sigma_o$ is then a well defined value. If, however, the character of the noise is unknown such as noise or signals provided by clouds, there is no fixed value $\sigma_o$ which will provide even a relatively constant false alarm rate.

In an adaptive threshold technique, a threshold is set at a value $k$ times $\sigma$, where $\sigma$ is the estimate of the means value of the actual background component present in a "window" in a field of view. A target decision is made when the amplitude of the signal taken from the middle of the window exceeds $k$ times $\sigma$. The window moves along with the changing field of view resulting in a time varying means value $\sigma$. In the adaptive threshold technique constant false alarm rate performance can be approached much more closely than in the technique utilizing a fixed threshold level.

The present invention is directed to the provision of apparatus which generates a threshold level which adapts to a changing background signal.

In carrying out the invention in an illustrative embodiment there is provided a first serial charge transfer shift register including a plurality of consecutive stages which are arranged into first, second and third consecutive groups of stages. Each of the stages of the first register including a respective first storage region. A second serial charge transfer shift register is provided including a plurality of consecutive stages which are arranged into first and second consecutive groups of stages. The second group has at least one stage and each of the stages of the second shift register include a respective second storage region. A first sampling means is provided for developing a first plurality of sequential first quantities of charge each related by a first constant of proportionality to a respective value of a sequential series of sampled values of a time varying signal. A first introducing means is provided for introducing each of the first quantities of charge into a respective first storage region of the first shift register. The first quantities of charge, stored in the third group of stages corresponds to values of the signal occurring during a first interval of time and the first quantities of charge stored in the first group of stages correspond to values of the signal occurring during a third interval of time subsequent to the first interval. A second sampling means is provided for developing a second plurality of sequential second quantities of charge each related by a second constant of proportionality to a respective value of sequential series of sampled values of the time varying signal. A second introducing means is provided for introducing each of the second quantities of charge into a respective second storage region of the second shift register. The number of stages of the first group of stages of the second shift register is set in relation to the number of stages of the first group of stages of the first shift register so that the quantities of charge stored in the second group of storage regions of the second shift register correspond to sampled values of the signal occurring during a second time interval between the first and third time intervals thereof. A first sensing means is provided for summing the total charge stored in the first storage regions of the first and third groups of stages of the first shift register and developing a first output proportional thereto. The first output is proportional to the sum of the sequential values of the signal included in the first and third intervals thereof. A second sensing means is provided for summing the total charge stored in the second storage regions of the second group of stages of the second shift register and developing a second output signal proportional thereto. The second output is proportional to the sum of the sequential values of the signal included in the second interval thereof. Means are provided for deriving a resultant signal representing the difference of the first and second output signals. Means are provided for deriving a threshold signal responsive to the change in polarity of the resultant signal.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein FIG. 1 is a graph of a signal useful in explaining the operation of the apparatus of the present invention.

FIG. 3 is a plan view showing the constructional details of the stages of the charge transfer shift registers of the apparatus of FIG. 2.

FIG. 4 is a sectional view of the embodiment of FIG. 3 taken along section lines 4—4 of FIG. 3.

Figure 1:
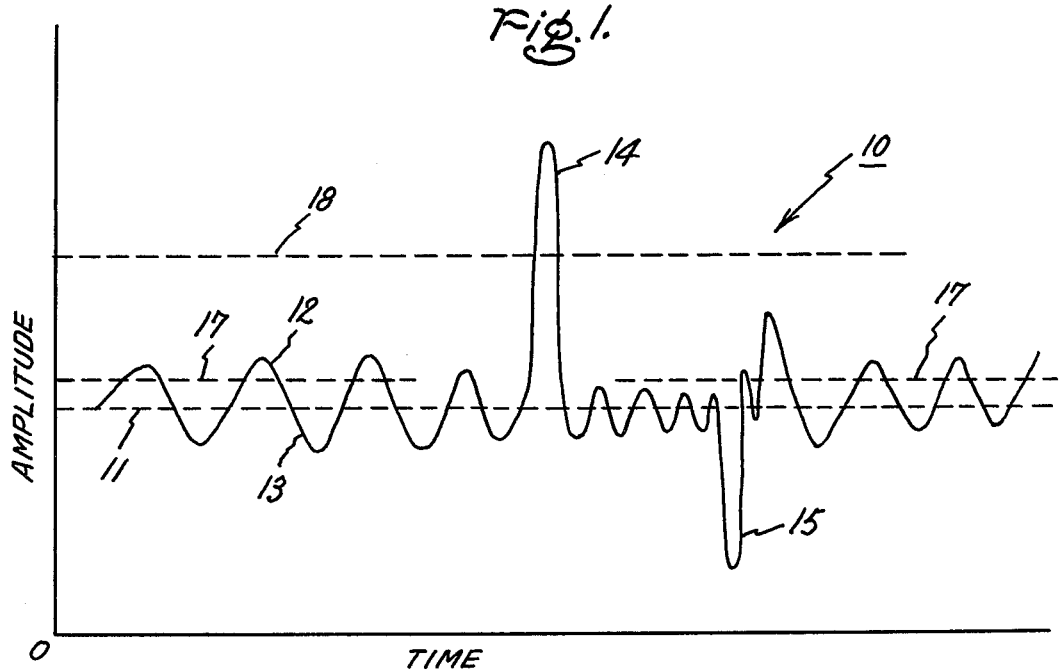

Reference is now made to FIG. 1 which shows a signal 10 with amplitude as a function of time useful in describing the functions performed by the apparatus of the present invention. The signal may be one that is obtained from a detector such as an infrared detector which detects variations in infrared radiation in a field of view as a function of time. The signal includes a d-c value or component 11, small excursions 12 above the d-c value, small excursions 13 below the d-c value, a large excursion 14 above the d-c value and a large excursion 15 below the d-c value. The small excursions in amplitude above and below the d-c value of the signal 10 represent the background component of the signal and in general represents noise. the large excursions in amplitude of signal above the d-c value may represent a target component of the signal particularly when the peak amplitude of the target component exceeds a threshold level which is some multiple of a mean value of the excursions of the background component of the signal above the d-c value. Accordingly, in providing alarm apparatus for detecting large excursions in a signal when the excursions exceed a particular threshold level above a mean value of the background component, several functions must be performed. First, a mean value of the background component must be obtained. Preferably the mean value of the background component is derived from the portions of the signal occurring before and after the occurrence of the target component. Second, a threshold level must be set which is a multiple of the meand value of the background component. Third, a means must be provided for indicating when the amplitude of large excursion exceeds the threshold level. In addition, it is highly desirable to maintain the constant of proportionality $k$ of the threshold level to the mean value of the background component of the signal constant for changing backgrounds to provide a relatively constant false alarm rate for all kinds of background conditions. Further, it is highly desirable to make the constant of proportionality $k$ variable so that it can be set at any desired ratio. In FIG. 1 the dotted line 17 represents a mean value of the background component of signal over an interval of time prior to the occurrence of the target component 14 and also subsequent to the occurrence of the target component. The mean value 17 may be obtained by simply half wave rectifying and averaging the positive excursions of the background component in the intervals before and after the target component. The mean value also may be obtained by utilizing a full wave rectifier to rectify the negative excursions of the background component in the two intervals as well. The mean value may also be obtained by securing the root mean square value of the background component over the two intervals. The threshold level 18 is then set at some multiple $k$ of the mean value 17. It is desirable that the multiple $k$ be variable to enable the false alarm rate to be adjustable. It is further desirable that when the field of view of the signal detector is changed and results in the formation of a signal with the different background component that the ratio $k$ of the threshold level to the mean value of the background signal be maintained constant so as to maintain a relatively constant false alarm rate.

The present invention is directed to the provision of apparatus which adapts to the mean value of a changing background signal.

Figure 2:
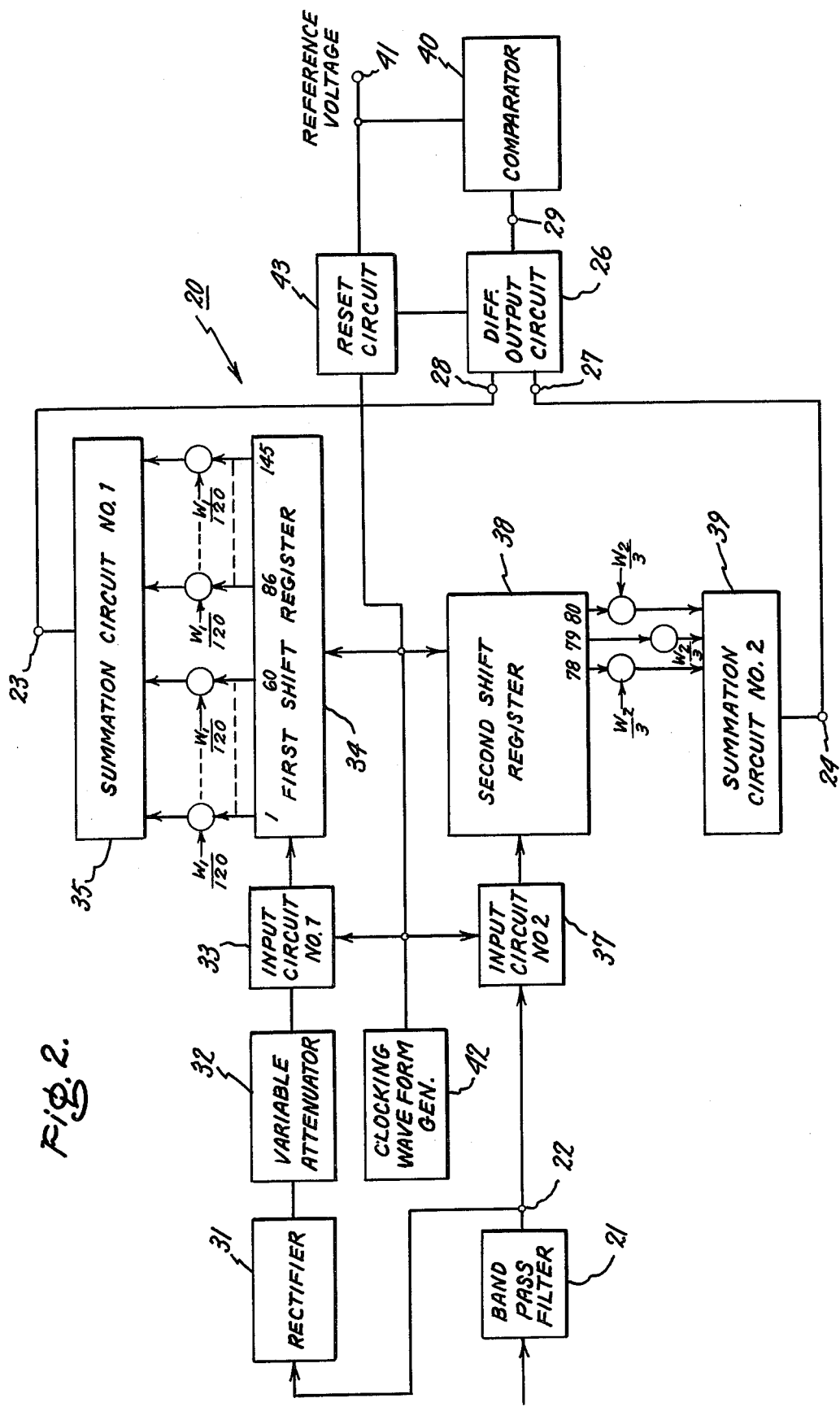
FIG. 2 shows a block diagram of the apparatus in accordance with the present invention utilizing charge transfer shift registers.

Reference is now made to FIG. 2 which shows a functional diagram of apparatus 20 in accordance with the present invention. The diagram shows a band pass filter 21 to which a signal such as signal 10 of FIG. 1 is applied to obtain the a-c component thereof which appears at input point 22. Also shown on the diagram are output points 23 and 24. At output point 23 appears an output proportional to a mean value of the background component of the rectified a-c component of the signal appearing at point 22 in a first interval and in a third interval subsequent to the first interval of the signal. At the output point 24 appears an output proportional to the sum of sequential values of the input signal included in a second interval of the signal 10 lying in time sequence between the first and third intervals of the signal. The output appearing at terminal 23 is applied to the noninverting terminal 27 of differential amplifier 26 and the output appearing at point 24 is applied to the inverting terminal 28 of the differential amplifier 26. Thus, at the output terminal 29 of the differential amplifier 26 is obtained a signal equal to the difference in a value preportional to a mean value of the rectified a-c component of the signal 10 in the first and third intervals thereof and the value of the a-c component of the signal 10 in a second interval thereof lying between the first and third intervals. When the signal appearing on input terminal 28 is less than the signal appearing at input terminal 27, a positive output is obtained at terminal 29. When the signals appearing on terminal 27 and 28 are equal, zero output is obtained at terminal 29. When the signal appearing at terminal 28 is greater than the signal appearing at terminal 27, a negative output appears at output terminal 29. A comparator 40 connected to the differential output circuit 26 and to a reference voltage terminal 41 is responsive to the change in polarity of the output appearing at output terminal 29 from a negative to a positive value to indicate the presence of an excursion in excess of a level such as level 18 of FIG. 1.

A first signal path is provided between input point 21 and first output point 23 and includes a rectifier 31 for rectifying the a-c component of the signal, a variable attenuator for attenuating the signal applied thereto by the factor $\alpha$, an input circuit 33 for developing a plurality of sequential first quantities of charge each related by a first constant of proportionality to a respective value of a sequential series of sample values of the applied signal. The input circuit 33, also introduces each of the first quantities of charge serially into a first shift register 34 by serially clocking the first quantities of charge therein. For purposes of illustration the first shift register is shown as comprising 145 stages. The consecutive stages are arranged into a first group of stages, including stages 1–60, a second group of stages including stages 61–85 and a third group of stages including stages 86–145. The first and third group of stages include a total of 120 stages. The interconnected stages have a weighting of $w_1$. Thus, each stage has a weighting of $w_1/120$. The output of the stages of the first and third group of shift registers is summed in a first summation circuit 35 to provide the summation output appearing at point 23. The net gain in the first signal path between point 21 and point 23 is $w_1/120 \times 120 \times \alpha$ or $w_1\alpha$.

A second signal path is provided between th input point 21 and the output point 24 and includes an input circuit 37 for developing a plurality of sequential second quantities of charge each related by a second constant of proportionality to a respective value of the sequential series of sample values of the applied signal. The input circuit 37 also introduces each of the second quantities of charge serially into the second shift register 38 by serially clocking the second quantities of charge therein. For purposes of illustration the second shift register comprises a total of eighty stages. The stages are arranged into first and second consecutive groups of stages. The first group includes stages 1 through 77 and the second group includes stages 78, 79 and 80. The output of the stages of the second group is provided with a weighting of $w_2$. Thus, each stage has a weighting of $w_2/3$. The outputs of the stages of the second group is summed in a summation circuit 39. The net gain in the second signal path between input point 22 and output point 24 is $w_2/3 \times 3$ or $w_2$. Thus, whenever a large excursion appears in the second time interval of the applied signal and has a value greater than $w_1/w_2 \alpha$ times the mean value of the background component of the signal, a change in polarity from negative to positive appears at terminal 29 and an output indication or alarm is produced in the comparator indicating that a test target signal has been received exceeding a preset amplitude equal to the mean value of the background component of the signal multiplied by the multiplying factor $w_1/w_2$ times $\alpha$. If $w_1/w_2$ is designated $k$, then the multiplying factor becomes $k\alpha$.

A clocking waveform generator 42 provides clocking waveforms to the input circuits 33 and 37, to shift registers 34–39 and to the reset circuit 43 of the differential output stage 26.

Figure 6:
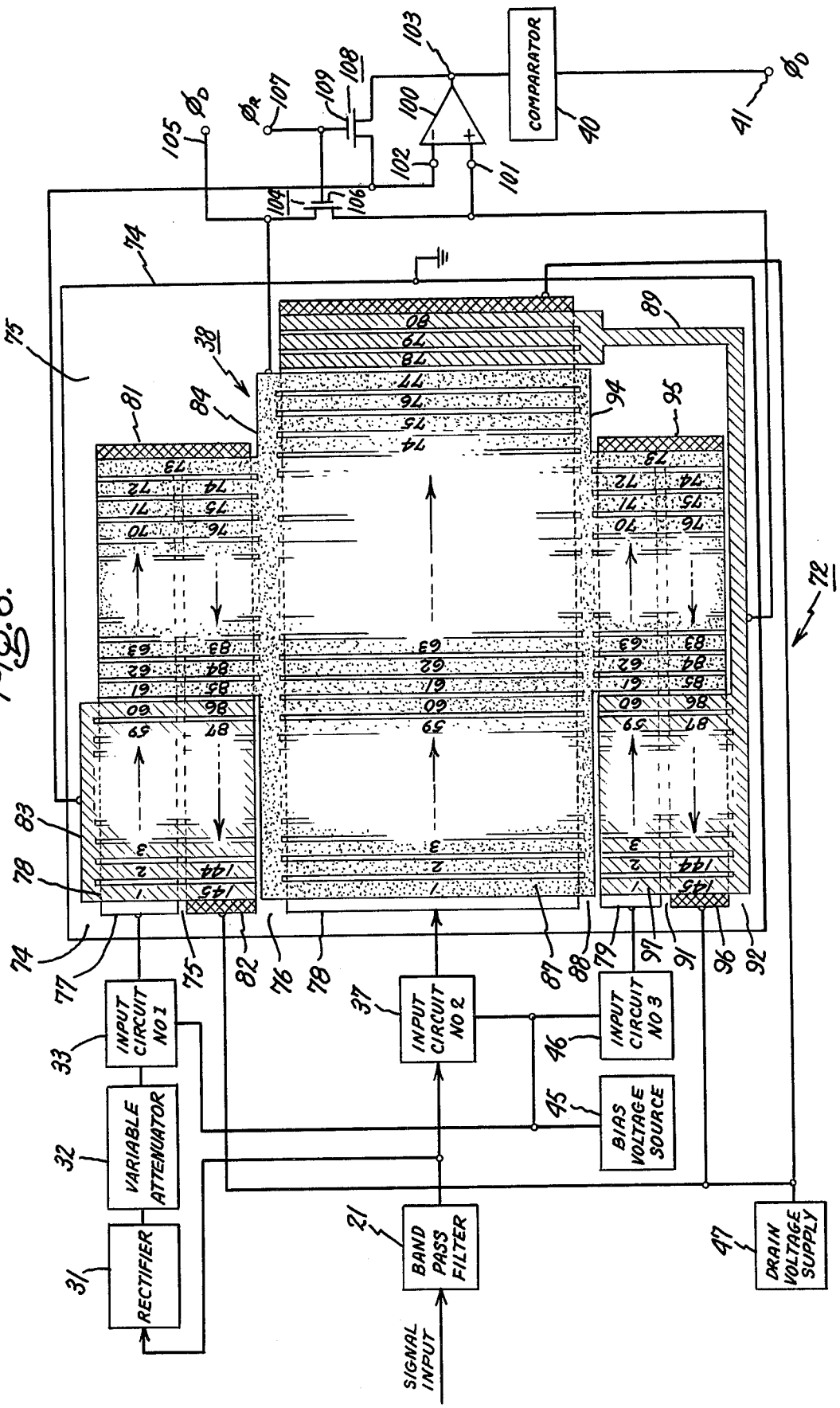
FIG. 6 shows a diagram of the signal detection apparatus in accordance with the present invention.

Reference is now made to FIGS. 3 and 4 which show one form of charge transfer shift register used in implementing the apparatus of FIGS. 2 and 6. The shift register 51 is formed on a substrate 52 of semiconductor material of N-type conductivity which has a channel portion 53 of uniform width adjacent a major surface 54 of the substrate. The substrate 52 may be silicon semiconductor material of 4 ohms centimeter resistivity. Overlying the major surface 54 of the substrate is a thick insulating member 55 of silicon dioxide having a thin portion 56 and a pair of outer ridges 57 and 58 providing boundaries for the thin portion 56. The thin portion 56 is of generally rectangular outline and lies in registry with the channel portion 53 of the substrate. A plurality of electrodes 61 are provided on the insulating member 55 overlying the thin portion 56 and orthogonal to the length thereof. Each of the electrodes 61 is of uniform length in the direction of the length of the semiconductor channel underlying the thin portion 56 and each of the electrodes 61 extends across the upper thick portion 57, the thin portion 56 and the lower thick portion 58. Another plurality of electrodes 62 are provided on the insulating member 55 overlying the thin portion 56 and orthogonal to the length thereof. Each of the electrodes 62 is of uniform length in the direction of the length of the thin portion and is substantially equal to the length of each of the electrodes 61. Each of the electrodes 61 is spaced between adjacent electrode 62 and each extends from a position overlying the upper boundary portion 57 and to a position overlying the lower boundary portion 58. The electrodes 61 and 62 are covered with a thin layer of insulating material 63. The plurality of transfer electrodes 64 are provided over the uncovered portions of the thin insulating layer 63 and portions of the ridges 57 and 58 of the insulating layer 55. Each of the transfer electrodes 64 is insulatingly spaced between the overlying a portion of a respective pair of adjacent electrodes 61 and 62. Each of the transfer electrodes 64 is of substantially uniform length in the direction of the length of the thin portion 56 and extends entirely over the thin portion of the insulating member as well as the bordering thick insulating portions.

The storage electrodes 61 are designated $\phi_D$ electrodes and are connected to a common line 66 which in turn is connected to a source of $\phi_D$ voltage. The storage electrodes 62 are designated $\phi_C$ electrodes and are connected to a common line 67 which in turn is connected to a source of $\phi_C$ clocking voltage. All of the transfer electrodes 64 which overlie a leading or input ledge of the first storage electrodes are designated as $\phi_D'$ electrodes and are connected to a common line 68 which in turn is connected to a source of $\phi_D'$ voltage. All of the transfer electrodes 64 which overlie a leading or input edge of a $\phi_C$ electrodes 62 are designated $\phi_C'$ electrodes and are connected to a common line 69 which in turn is connected to a source of $\phi_C'$ voltage. A conductive layer 49 of a suitable material such as gold is eutecticly bonded to the lower surface of the substrate 52 to provide a substrate contact to which the ground line of the $\phi_D$, $\phi_D'$, $\phi_C$, and $\phi_C'$ sources are connected.

Figure 5:
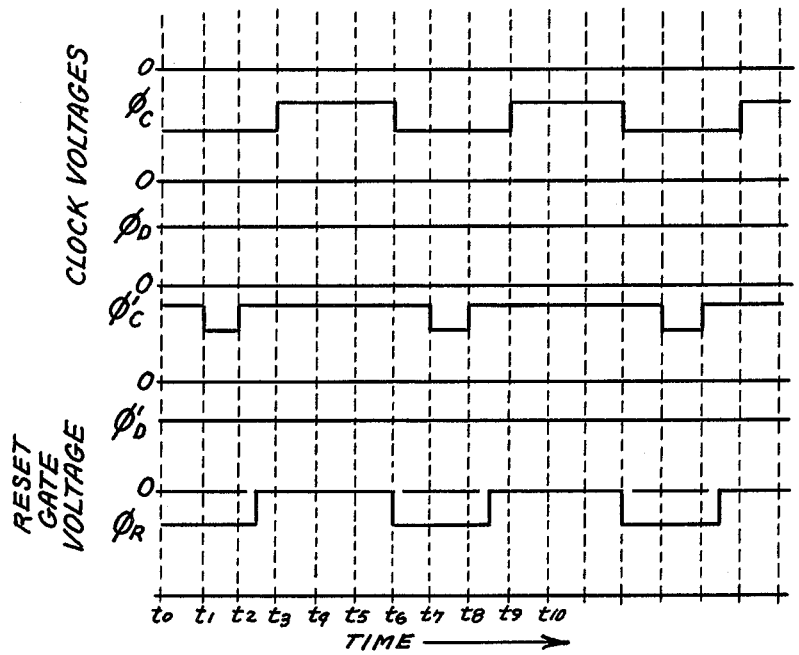
FIG. 5 shows the diagram of amplitude versus time of voltage waveforms utilized for functioning the shift register of FIGS. 3 and 4, and also for functioning the signal detection apparatus of FIG. 6.

The manner in which quantities or packets of charge are clocked into the shift register 51 and transferred from stage to stage along the shift register will now be described in connection with the diagrams of FIG. 5 which shows the clocking waveforms $\phi_C$, $\phi_D$, $\phi_C'$ and $\phi_D'$ and the reset gate voltage waveform $\phi_R$ utilized in connection with the operation of the apparatus of FIGS. 2 and 6. For the structure shown utilizing a silicon substrate of N-type conductivity and having a resistivity of about 4 ohm centimeters, an oxide thickness under the first and second electrodes of 1000 Angstroms and an oxide thickness under the transfer electrodes of 2000 Angstroms typical values of voltage which may be used in the waveform thereof are depicted in FIG. 5. The $\phi_C$ voltage levels are about −6 volts and −28 volts. The $\phi_C'$ voltage levels are about −3 volts and −22 volts. The $\phi_D$ voltage is a fixed voltage lying between the extreme values of the $\phi_C$ voltage and is shown as about −15 volts. The $\phi_D'$ voltage is a fixed voltage lying between the extreme values of the $\phi_C'$ voltage and is shown about −9 volts.

The packets of charge are clocked from stage to stage by cycling the $\phi_C$ voltage on the $\phi_C$ electrodes above and below the $\phi_D$ voltage on the $\phi_D$ electrodes thereby causing the storage regions underlying the $\phi_C$ electrodes alternately to send charge to the storage regions underlying $\phi_D$ electrodes on the one half of a clocking cycle and to receive charge from the storage regions underlying the $\phi_D$ electrodes on the second half of a clocking cycle. The voltage $\phi_C'$ applied to the $\phi_C'$ transfer electrodes 64 is alternately cycled above and below the $\phi_D'$ voltage applied to the transfer gate electrodes $\phi_D'$. The $\phi_C'$ electrodes and the $\phi_D'$ electrodes along with the $\phi_C'$ and $\phi_D'$ voltages applied thereto cause the charges to transfer from left to right in the shift register from stage to stage.

Input circuits such as input circuits 33 and 37 of FIG. 2 for generating packets of charge representing samples of a time varying analog signal and for introducing the packets into the shift register are well known in the art. One such circuit is described in connection with FIGS. 8a, 8b and 8c of patent application Ser. No. 609,415 filed September 2, 1975 and assigned to the assignee of the present invention and is incorporated herein by reference thereto. This particular circuit is referred to as a "fill and spill" circuit. Of course, other input circuits providing such functions may be utilized.

Reference is now made to FIG. 6 which shows a diagram of the apparatus 70 similar to the apparatus 20 shown in block form in FIG. 2. In the apparatus 70 a third shift register 72 is shown in addition to the first and second shift registers 34 and 38 of the apparatus of FIG. 2. The structure and operation of the third shift register 72 in the apparatus will be described below. The elements of the apparatus 70 of FIG. 6 identical to the elements of the apparatus 20 of FIG. 2 are identically designated. A plan view of the three shift registers of the apparatus 70 is shown with only the $\phi_D$ electrodes of the shift registers shown. In order to simplify the illustration and description of the structure of the shift registers and their operation the $\phi_C$, the $\phi_D{}'$ and the $C_C{}'$ electrodes of shift registers are not shown. In all three shift registers 34, 38 and 72, the $\phi_D$ electrodes are shown closely spaced. It will be understood that included between each adjacent pair of $\phi_D$ and the $\phi_C$ electrodes are $\phi_D{}'$ transfer gate electrodes organized in the manner described in connection with FIGS. 3 and 4.

The first shift register 34, the second shift register 38 and the third shift register 72 are formed on a common substrate 74 of N-type semiconductor material. A thick layer of silicon dioxide 75 is provided over a major face of the substrate 74 and includes a first thin portion 77 in which the first shift register 34 is formed, a second thin portion 78 in which the second shift register 38 is formed, and a third thin portion 79 in which the third shift register 72 is formed. In order to provide compactness in structure the first thin portion is composed of two parts, a first part included between thick oxide ridges 74 and 75 and a second part included between thick oxide ridges 75 and 76. The thin portion 77 is of uniform width with the first part extending to a diffused region 81 in the substrate and the second part extending from the diffused region 81 to a drain diffused region 82 in the substrate. Both regions 81 and 82 are of a conductivity type opposite to the conductivity type of the substrate. A plurality of first electrodes 78 are provided overlying the two parts of the thin insulating portion 77 to form the $\phi_D$ storage electrodes of stages 1–145 of the first shift register. The stage numbers are shown on the $\phi_D$ electrodes. The diffused region 81 in conjunction with $\phi_D$ electrode number 73 functions to provide a good conduction turn around path for charges clocked from $\phi_D$ electrode 72 to $\phi_D$ electrode 74. When $\phi_D$ voltage is applied to $\phi_D$ electrodes, storage regions are formed underlying the $\phi_D$ electrodes in the thin oxide portion 77. In conjunction with the $\phi_C$ and the $\phi_D{}'$ and the $\phi_C{}'$ electrodes (not shown) and the clocking voltages applied thereto charge introduced into the $\phi_D$ region of the first stage is clocked from $\phi_D$ storage regions of one stage to the $\phi_D$ storage regions of the next stage down the shift register until the charge is collected in the drain 82. The storage regions are formed in a channel region of the substrate underlying the thin oxide region 77. The $\phi_D$ electrodes of the first shift register and hence the stages of the shift register are arranged into a first, second and third consecutive groups. The first group of consecutive electrodes consists of the electrodes of stages 1–60, the second group of electrodes includes electrodes of stages 61–85 and the third group of electrodes consists of the electrodes of stages 86–145. As will be explained below, the $\phi_D$ electrodes are organized for sensing the charge transferred to the storage regions underlying the $\phi_D$ electrodes and hence are utilized for sensing the charge stored in the stages of the shift register. To this end the $\phi_D$ electrodes of the first group of stages and the third group of stages are connected to a common line 83 and thus the charge stored under the $\phi_D$ electrodes in the first and third group of stages may be readily summed. The summation is accomplished by resetting or charging the $\phi_D$ line 83 to $\phi_D$ voltage and floating it. Thereafter charge is transferred into the storage regions underlying the $\phi_D$ electrodes. The charge flow in conductor 83 is sensed to obtain the sum of the charges transferred into the $\phi_D$ electrodes and hence stored in the stages of the first and third group of stages of the shift register. The $\phi_D$ electrodes of the second group of stages is connected to conductive line 84 which is connected to the $\phi_D$ source of voltage.

The second thin portion 78 of silicon dioxide is of uniform width and is included between the ridge portions 76 and 86 of thick oxide. A plurality of $\phi_D$ electrodes 87 are provided overlying the thin oxide portion 78, a total of 80 in number. A diffused region 88 of P-type conductivity provides a drain for the collection of charge transferred in the shift register. The $\phi_D$ electrodes 87 are divided into two groups, one group including consecutive electrodes 1 through 77 and the second group including consecutive electrodes 78, 79 and 80. The electrodes of the second group are connected to a conductive line 89. The charges transferred to the second group of stages is summed by resetting or charging the $\phi_D$ line 89 to $\phi_D$ voltage and floating it. Thereafter charge is transferred into the storage regions underlying the $\phi_D$ electrodes and sensing the charge flow in conductor 89 to obtain the sum of the charges transferred into the storage regions underlying the $\phi_D$ electrodes and hence stored in the stages of the second group of stages of the second shift register. The $\phi_D$ electrodes of the first group of stages is connected to conductive line 84.

The third thin portion 79 consists of two parts, a first part included between ridge portions 86 and 91 of thick oxide and a second part included between ridge portions 91 and 92 of thick oxide. The thin portion 79 is of width with the first part extending to a diffused region 95 in the substrate and the second part extending from the diffused region 95 to a drain diffused region 96 in the substrate. Both regions 95 and 96 are of a conductivity type opposite to the conductivity type of the substrate. A plurality of first electrodes 97 are provided overlying the two parts of the thin insulating portion 79 to form the $\phi_D$ storage electrodes of stages 1–145 of the shift register. The stage numbers are shown on the $\phi_D$ electrodes. The diffused region 95 in conjunction with $\phi_D$ electrode No. 73 functions to provide a good conduction turn around path for charges clocked from $\phi_D$ electrode No. 72 to $\phi_D$ electrode No. 74. The $\phi_D$ electrodes 97 of the third shift register and hence the stages of the third shift register are arranged into a first, second and third consecutive groups of stages. The first group of consecutive electrodes consists of the electrodes of stages 1–60, the second group of electrodes consists of the electrodes of stages 86–145. The $\phi_D$ electrodes of the first and third group of stages are connected together and to conductive line 89, the same line to which the $\phi_D$ electrodes of the second group of stages of the second shift register are connected. The $\phi_D$ electrodes of the second group of stages of the third shift register are connected to a conductive 94 line which connects with the $\phi_D$ electrodes of the first group of stages of the second shift register and the conductive line 84.

All of the $\phi_D$ electrodes 78, 87 and 97 of the first, second and third shift registers are uniformly spaced with respect to the surface of the substrate 74. The length of the $\phi_D$ electrodes of the first, second and third shift register in the direction of charge transfer is uniform. A relative weighting of the summation of charge samples stored in the first and third group of $\phi_D$ electrodes of the first shift register with respect to the charge samples stored in the $\phi_D$ electrodes of the second group of stages of the second shift register, designated $w$, is provided by setting the product of the number of $\phi_D$ electrodes 78 in the first and third groups of the first shift register times the width thereof equal to $w$ times the number of electrodes in the second group of the second shift register times the width thereof. For example, with the width of the $\phi_D$ electrodes 78 of the first shift register is set to 2.5 mils and the width of the $\phi_D$ electrodes 87 in the second shift register set equal to 10 mils, the weighting factor is 10.

As charge is clocked from stage to stage in the first shift register and also in the second shift register, the sum of the charges clocked into and stored in the first and third group of stages in the first shift register appear as induced charges on conductor 83. Similary, the charge transferred into the second group of stages of the second shift register appear as induced charges on line 89. In order to sense the induced charges on lines 83 and 89 as changes in voltage suitable for comparison the capacitances associated with line 83 and line 89 must be equal. To this end the third shift register with $\phi_D$ electrodes 97 connected to line 89 is provided. The third shift register provides additional functions which will be explained in more detail below. The width of the $\phi_D$ electrodes of the third shift register and in particular of the first and third group of stages thereof which are connected to line 89 is set so that the width times the number thereof provides a capacitance which when added to the capacitance of the second group of $\phi_D$ electrodes 87 of the second shift register equals the capacitance of the first and third group of electrodes of the first shift register. The voltages are referenced to substrate 74 which is shown as ground. In other cases a substrate bias may be used with the ground potential determined by the reference ground level of the input signal.

Differential sensing of the voltage signals appearing on lines 83 and 89 is provided by differential amplifier 100 having a non-inverting terminal 101 connected to line 89 and an inverting terminal 102 connected to line 83 and an output terminal 103. The non-inverting terminal 101 is connected through the source to drain conduction path of a transistor switch 104 to the $\phi_D$ voltage line 105. The gate 106 of transistor 104 is connected to terminal 107 to which reset gate voltage $\phi_R$ shown in FIG. 5, is applied. The source to drain conduction path of another transistor switch 108 is connected between the inverting terminal 102 and the output terminal 103. The gate 109 of the transistor 108 is connected to reset terminal 107. Thus, as apparent from the waveform diagrams of FIG. 5 as charge is transferred from the $\phi_D$ storage regions to the $\phi_C$ storage regions, the $\phi_D$ electrodes of the shift registers are connected to a $\phi_D$ voltage while just prior to the time that charge is transferred from the $\phi_C$ storage sites to the $\phi_D$ storage sites, the $\phi_D$ voltage is disconnected from the lines 83 and 89 by removal of reset voltage $\phi_R$ from the gates of transistor switches 104 and 108 resulting in a floating of the $\phi_D$ lines connected to the non-inverting terminal 101 and to the inverting terminal 102. Accordingly, at time $t_3$ (FIG. 5) when the $\phi_C$ voltage rises and charge is transferred to the $\phi_D$ regions, changes in voltage are produced on the lines 83 and 89 resulting in a net output at terminal 103. Thus, as charge is clocked into the first shift register and into the second shift register over each cycle, at the output of the differential amplifier 100 a signal is obtained depending upon the relative magnitude of the charges transferred under the $\phi_D$ electrodes of the first and third group of electrodes of the first shift register and charges transferred under the $\phi_D$ electrodes of the second group of electrodes of the second shift register. A comparator circuit 40 connected to the output terminal 103 and also to reference level voltage $\phi_D$ provides a alarm or indication when the output at terminal 103 changes in polarity in relation to reference level voltage $\phi_D$.

The operation of the system of FIG. 6 will now be explained in connection with the signal 10 of FIG. 1. The signal 10 is applied to the band pass filter 21 which removes the $d$–$c$ component 11. The resultant $a$–$c$ signal is applied over a first path to the rectifier 31 and a variable attenuator 32. The input circuit 33 develops a first plurality of sequential first quantities of charge each related by a first constant of proportionality to a respective value of a sequential series of sample values of the signal applied thereto. Each of the first quantities of charge are serially clocked from stage to stage into the first shift register 34 by operation of the clocking waveform generator 40 shown in FIG. 2. The signal obtained at the output of the band pass filter 21 is also applied to the input circuit 37 which develops a second plurality of sequential second quantities of charge each related by a second constant of proportionality to a respective value of the sequential series of sample values of the signal. Each of the second quantities of charge are serially introduced and clocked by the clocking waveform generator from stage to stage of the shift register. In the first shift register the first constant of proportionality is a function of the width of the $\phi_D$ electrodes 78 and the attenuation setting of the variable attenuator 32. In the second shift register the second constant proportionality is a function of the width of the $\phi_D$ electrodes 78. The variable attenuator 32 is set with an attenuation $\alpha$ such that the level of the output obtained on electrode 83 is a multiple $k$ of the mean value of the rectified $a$–$c$ signal. $k$ is equal to $\alpha$ times the relative weighting $w$ of the electrodes of the first shift register and the second shift register as explained above.

In the first shift register, the first quantities of charges stored in the third group of stages correspond to values of the composite signal occurring during a first interval of time and the first quantities of charge stored in the first group of stages corresponds to values of the signal occurring during a third interval of time subsequent to the first interval of time. As the delay in each of the stages of the first and second shift registers is the same, the quantities of charge stored in the second group of storage regions of the second shift register correspond to sample values of the signal occurring during a second time interval of the signal occurring between the first and third time intervals thereof. Thus, as the signals are clocked into the first and second shift registers the output initially appearing at output terminal 103 of amplifier 100 would be negative, as the threshold level is set to be a muliple $k$ of the mean value of the background signal, until samples corresponding to the large excursion 14 are transferred into the storage regions underlying the $\phi_D$ electrodes of the second group of stages of the second shift register, at which time the output changes polarity. The magnitude of the output would be proportional to the magnitude of the excursion 14 above the threshold level 18. When the output at terminal 103 is positive with respect to $\phi_D$ voltage level an alarm or indication is produced by comparator circuit 40.

A bias voltage source 45 is connected to the input circuit 33 of the first shift register 34 and to the input circuit of the second shift register 38 to provide a level of bias charge in the two shift registers to minimize the effect of surface states on the signal charge introduced into and clocked in the first and second shift registers. Input circuit 46 of the third shift register is also connected to bias voltage source 45 and applies the same level of bias charge to the third shift register to dynamically balance the capacitances of lines 83 and 72, as described above, and as explained more fully in patent application Ser. No. 609,415, filed Sept. 2, 1975 and assigned to the assignee of the present invention. In this connection provision of the third shift register balances the dark current or leakage current components in the shift registers. The third shift register also balances the clock voltages coupled through to the output lines 83 and 89 so that these in-phase voltages are rejected by the differential amplifier 100 to provide an output which is free of any clock pulses.

A drain supply 47 is connected to drain regions 77, 88 and 91 to collect the charge clocked through the first, second and third shift registers, respectively.

To sense large negative excursions in the signal 10 of FIG. 1, such as signal component 15, as well as large positive excursions, such as signal component 14, a rectifier would be provided between the output of the band pass filter 21 and input circuit 37. To sense only large negative excursions such as signal component 15, a signal inverter would be provided in the signal path between the band pass filter 21 and the input circuit 37.

While the first, second, and third shift registers signal detection apparatus are separated by means of relatively thick regions of the insulating silicon dioxide, other embodiments employing a region of more heavily doped substrate at the surface to separate the three shift registers may also be used. Such more heavily doped regions are commonly referred to as channel stops.

While the invention has been described in connection with signal detection apparatus constituted of N-type conductivity substrates, P-type conductivity substrates could as well be used. Of course, in such a case the applied potentials would be reversed in polarity.

While the invention has been described in specific embodiments it will be appreciated that modifications, such as those described above, may be made by those skilled in the art and it is intended by the appended claims to cover all such modifications and changes as fall within the true spirit and scope of the invention.

What we claim as new and desire to secure by Letters Patent of the U.S. is:

1. Signal detection apparatus with adaptive threshold for sensing large excursions of a time varying signal from its average value comprising, a first serial charge transfer shift register including a plurality of consecutive stages, said consecutive stages arranged into first, second and third consecutive groups of stages, each of said stages of said first shift register including a respective first storage region, a second serial charge transfer shift register including a plurality of consecutive stages, said consecutive stages arranged into first and second consecutive groups of stages, said second group having at least one stage, each of said stages of said second shift register including a respective second storage region, first sampling means for developing a first plurality of sequential first quantities of charge each related by a first constant of proportionality to a respective value of a sequential series of sampled values of a time varying signal, first introducing means for introducing each of said first quantities of charge into a respective first storage region of said first shift register, said first quantities of charge, stored in said third group of stages corresponding to values of said signal occurring during a first interval of time and said first quantities of charge stored in said first group of stages corresponding to values of said signal occurring during a third interval of time subsequent to said first interval, second sampling means for developing a second plurality of sequential second quantities of charge each related by a second constant of proportionality to a respective value of said sequential series of sampled values of said time varying signal, second introducing means for introducing each of said second quantities of charge into a respective second storage region of said second shift register, the number of stages of said first group of stages of said second shift register being set in relation to the number of stages of said first group of stages of said first shift register so that the quantities of charge stored in said second group of storage regions of said second shift register correspond to sampled values of said signal occurring during a second time interval of said signal occurring between said first and third time intervals of said signal, first sensing means for summing the total charge stored in the first storage regions of said first and third groups of stages of said first shift register and developing a first output proportional thereto, said first output being proportional to the sum of said sequential values of said signal included in said first and third intervals thereof, second sensing means for summing the total charge stored in the second storage regions of said second group of stages of said second shift register and developing a second output signal proportional thereto, said second output being proportional to the sum of said sequential values of said signal included in said second interval thereof, means for deriving a resultant signal representing the difference of said first and second output signals, means for deriving a threshold signal responsive to the change in polarity of said resultant signal.

2. The apparatus of claim 1 in which means are provided for varying said first constant of proportionality.

3. The apparatus of claim 1 in which said first sampling means is provided with means for developing a first plurality of sequential first quantities of charge each related by said first constant of proportionality to a respective value of a sequential series of sampled values of the excursions of said signal from the average value thereof.

4. The apparatus of claim 1 in which said first introducing means includes means for introducing into the first stage of said first shift register and thereafter serially transferring from stage to stage each of said first quantities of charge to a respective stage of said shift register, and in which said second introducing means includes means for introducing into the first stage of said second shift register and thereafter serially transferring from stage-to-stage each of said second quantities of charge to a respective stage of said second shift register.

5. The apparatus of claim 1 in which said first shift register comprises a substrate of one conductivity type semiconductor material including a first channel portion adjacent a major surface of said substrate, said first storage regions lying within said first channel portion, and a plurality of first electrodes each insulatingly overlying a respective one of said storage regions and coextensive therewith,
- in which said first sensing means includes a first conductive line connected to the first electrodes of said first and third group of stages of said first shift register,
- in which said second shift register includes a second channel portion adjacent said major surface of said substrate, said second storage regions lying within said second channel portion, and a plurality of second electrodes each insulatingly overlying a respective one of said second storage regions and coextensive therewith,
- and in which said second sensing means includes a second conductive line connected to the second electrodes of said second group of stages of said second shift register.

6. The apparatus of claim 5 in which the lengths of the electrodes of said first shift register are uniform and equal to a first value and in which the widths of the electrodes of said first shift register are uniform and equal to a second value,
- in which the lengths of the electrodes of said second shift register are uniform and equal to said first value and in which the widths of the electrodes of said second shift register are uniform and equal to a third value,
- and in which the spacing of said electrodes of said first and second shift registers from said major surface of said substrate is substantially uniform and equal to a fourth value.

7. The apparatus of claim 6 including
- a third serial charge transfer shift register including a plurality of consecutive stages, said consecutive stages arranged into first, second and third consecutive groups of stages, each of said stages of said third shift register including a respective third storage region,
- said third shift register comprising a third channel portion adjacent said major surface of said substrate, said storage regions lying within said third channel portion, and a plurality of third electrodes, each insulatingly overlying a respective one of said third storage regions and coextensive therewith, the spacing of said third electrodes from said major surface being uniform and equal to said fourth value, the length of each of the third electrodes being uniform and equal to said first value, the width of each of the third electrodes being uniform and equal to a fifth value,
- the number of stages in said first group of stages of said third shift register being equal to the number of stages in said first group of stages of said first shift register,
- the number of stages in said second group of stages of said third shift register being equal to the number of stages in said second group of stages of said first shift register,
- the number of states in said third group of stages of said third shift register being equal to the number of stages in said third group of stages of said first shift register,
- the first electrodes of said first and third groups of said first shift register providing a first total capacitance with respect to said substrate,
- the third electrodes of the stages of said first and third groups of stages of said third shift register being connected to the second electrodes of said second group of stages of said second shift register and providing a second total capacitance with respect to said substrate equal to said first total capacitance.

8. The apparatus of claim 1 in which the number of stages in each of said first and third group of stages of said first shift register is substantially greater than the number of stages in said second group of stages of said second shift register.

* * * * *